US008908416B2

(12) United States Patent
Minemura et al.

(10) Patent No.: US 8,908,416 B2
(45) Date of Patent: *Dec. 9, 2014

(54) SEMICONDUCTOR MEMORY DEVICE

(71) Applicant: Kabushishi Kaisha Toshiba, Minato-ku (JP)

(72) Inventors: Yoichi Minemura, Yokkaichi (JP);
Takayuki Tsukamoto, Yokkaichi (JP);
Hiroshi Kanno, Yokkaichi (JP);
Takamasa Okawa, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/152,530

(22) Filed: Jan. 10, 2014

(65) Prior Publication Data

US 2014/0126270 A1    May 8, 2014

Related U.S. Application Data

(63) Continuation of application No. 13/600,448, filed on Aug. 31, 2012, now Pat. No. 8,665,634.

(30) Foreign Application Priority Data

Dec. 5, 2011    (JP) ................................. 2011-265984

(51) Int. Cl.
*G11C 13/00* (2006.01)
*G11C 7/00* (2006.01)
*G11C 11/16* (2006.01)
*G11C 11/419* (2006.01)

(52) U.S. Cl.
CPC ........ *G11C 13/0002* (2013.01); *G11C 13/0069* (2013.01); *G11C 13/0009* (2013.01); *G11C 11/1673* (2013.01); *G11C 11/419* (2013.01); *G11C 13/0004* (2013.01); *G11C 13/0007* (2013.01); *G11C 13/0011* (2013.01); *G11C 13/0097* (2013.01); *G11C 2213/71* (2013.01); *G11C 2213/72* (2013.01)
USPC ....................... 365/148; 365/63; 365/189.011

(58) Field of Classification Search
CPC ..................... G11C 13/0002; G11C 2013/009; G11C 11/1673; G11C 11/419
USPC .................................. 365/148, 163, 189.011
See application file for complete search history.

(56) References Cited

U.S. PATENT DOCUMENTS

| 7,936,586 B2 | 5/2011 | Hosono et al. |
| 7,978,499 B2 | 7/2011 | Hosono et al. |
| 7,990,754 B2 | 8/2011 | Azuma et al. |
| 2004/0257864 A1 | 12/2004 | Tamai et al. |

FOREIGN PATENT DOCUMENTS

| JP | 2009-266312 A | 11/2009 |
| JP | 2011-118970 A | 6/2011 |
| WO | WO 2008/117494 A1 | 10/2008 |

OTHER PUBLICATIONS

Office Action issued Jun. 17, 2014, in Japanese Patent Application No. 2011-265984 with English translation.

*Primary Examiner* — Ly D Pham
(74) *Attorney, Agent, or Firm* — Oblon, Spivak, McClelland, Maier & Neustadt, L.L.P.

(57) ABSTRACT

A memory cell array includes memory cells disposed at intersections of first lines and second lines, and each having a rectifying element and a variable resistance element connected in series. A control circuit, when performing an operation to change retained data, applies a first voltage to a selected first line and applies a second voltage to a selected second line; furthermore, applies a third voltage to a nonselected first line; and, moreover, applies a fourth voltage larger than the third voltage to a non-selected second line. An absolute value of a difference between the third voltage and the fourth voltage is set smaller than an absolute value of a difference between the first voltage and the second voltage by an amount of an offset voltage. A value of the offset voltage increases as the absolute value of the difference between the first and second voltages increases.

22 Claims, 15 Drawing Sheets

Characteristic of Bi-direction Diode Di

SEMICONDUCTOR MEMORY DEVICE

CROSS REFERENCE TO RELATED APPLICATIONS

This application is a Continuation of application Ser. No. 13/600,448 filed on Aug. 31, 2012, which is based on and claims the benefit of priority from prior Japanese Patent Application No. 2011-265984, filed on Dec. 5, 2011, the entire contents of which are incorporated herein by reference.

FIELD

Embodiments described in the present specification relate to a semiconductor memory device.

BACKGROUND

In recent years, resistance varying memory is receiving attention as a potential successor to flash memory. Resistance varying memory generally has a cross-point type structure configured having memory cells arranged in a matrix at intersections of a plurality of bit lines and a plurality of word lines intersecting the bit lines, each of the memory cells comprising a variable resistance element and a rectifying element.

In such a cross-point type resistance varying memory, a non-selected memory cell, as distinct from a selected memory cell subject to operations such as a write operation or erase operation, is applied with a voltage having a reverse bias with respect to the rectifying element. A leak current occurs in the non-selected memory cell applied with the reverse bias voltage. This leads to the problem that, as the number of non-selected memory cells increases, the leak current increases whereby power consumption increases, and so on.

DETAILED DESCRIPTION

A semiconductor memory device in an embodiment described below comprises a memory cell array and a control circuit. The memory cell array includes memory cells that are disposed at intersections of a plurality of first lines and a plurality of second lines, the plurality of first lines and second lines being formed so as to intersect one another, and each of the memory cells having a rectifying element and a variable resistance element connected in series. The control circuit selectively drives the first lines and the second lines. The control circuit, when performing an operation to change retained data of a selected memory cell selected from among a plurality of the memory cells, applies a first voltage to a selected first line which is a first line connected to the selected memory cell and applies a second voltage to a selected second line which is a second line connected to the selected memory cell; furthermore, applies a third voltage to a non-selected first line which is a first line other than the selected first line; and, moreover, applies a fourth voltage which is larger than the third voltage to a non-selected second line which is a second line other than the selected second line. An absolute value of a difference between the third voltage and the fourth voltage is set smaller than an absolute value of a difference between the first voltage and the second voltage by an amount of an offset voltage. In addition, the control circuit increases a value of the offset voltage as the absolute value of the difference between the first voltage and the second voltage increases.

Embodiments of the present invention are described below with reference to the accompanying drawings. As an example, a semiconductor memory device of the present embodiment may be configured as a resistance varying memory device having a three-dimensional memory cell array structure of stacked memory cell arrays. However, this configuration is merely an example.

[First Embodiment]

Figure 1:
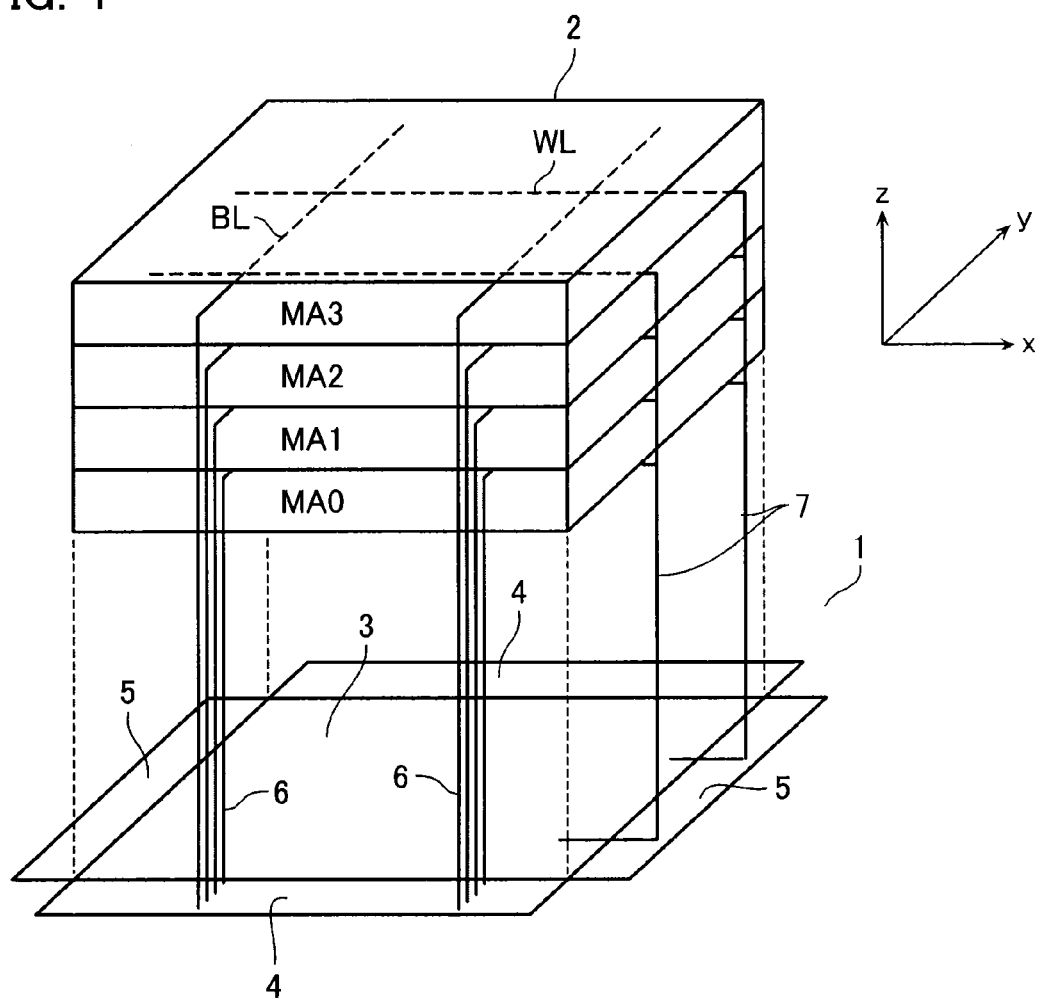
FIG. 1 is a perspective view showing a configuration of a semiconductor memory device in a first embodiment.

FIG. 1 shows a basic configuration of the resistance varying memory device according to a first embodiment, that is, a configuration of a wiring region 3 having wiring lines such as a global bus formed on a semiconductor substrate 1, and a memory block 2 stacked on the wiring region 3.

As shown in FIG. 1, in this example, the memory block 2 is configured from four layers of memory cell arrays MA0-MA3. The semiconductor substrate 1 directly below the memory block 2 is provided with the wiring region 3. The wiring region 3 is provided with a global bus for exchanging data to be written to/read from the memory block 2 with external, or the like. In addition, this wiring region 3 may be provided with a column system control circuit including a column switch and so on, and a row system control circuit including a row decoder and so on, which are to be described later.

In order to connect word lines WL and bit lines BL of each of the stacked memory cell arrays MA with the wiring region 3 formed on the semiconductor substrate 1, vertical wiring (a via contact) is required in a side surface of the memory block 2. The four sides of the wiring region 3 are provided with bit line contact regions 4 and word line contact regions 5. Bit line contacts 6 and word line contacts 7 for connecting the bit lines BL and word lines WL to control circuits are formed in the bit line contact regions 4 and word line contact regions 5. The word lines WL have their one ends connected to the wiring region 3 via the word line contacts 7 formed in the word line contact regions 5. Moreover, the bit lines BL have their one ends connected to the wiring region 3 via the bit line contacts 6 formed in the bit line contact regions 4.

FIG. 1 shows one memory block 2 having a plurality of memory cell arrays MA stacked in a direction perpendicular to the semiconductor substrate 1 (z direction shown in FIG. 1). A plurality of such unit memory blocks 2 may be disposed in a matrix in a longer direction of the word lines WL (x direction shown in FIG. 1) and a longer direction of the bit lines BL (y direction shown in FIG. 1).

As shown in FIG. 1, in the word line contact regions 5 of the present embodiment, only a single row of contacts is connected to the wiring region 3. That is, the word lines WL of all layers in a cross-section are connected to the wiring region 3 via a common contact. Moreover, in the bit line contact regions 4 of the present embodiment, the bit lines BL of each layer are connected to the wiring region 3 via four columns of contacts separately provided. In the present embodiment, the bit lines BL are independently driven in each layer, and the word lines WL are commonly connected between all layers. However, the word lines WL may also be configured to be independently driven. Moreover, the bit lines BL may be configured to be commonly driven and the word lines WL independently driven. Furthermore, at least one of the bit lines BL and word lines WL may be configured to be shared by layers above and below.

Figure 2A:
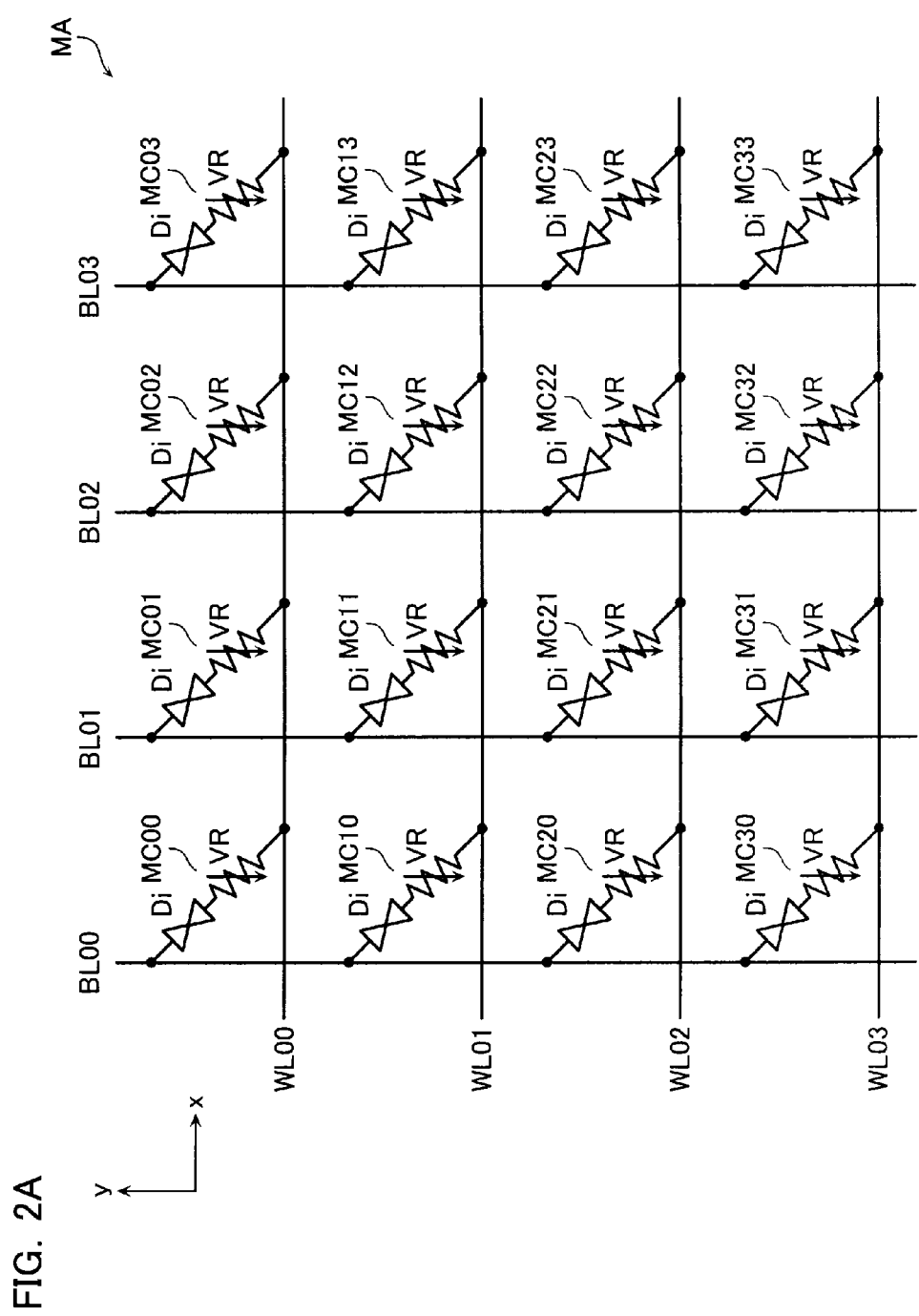
FIG. 2A is an equivalent circuit diagram of a memory cell array in the semiconductor memory device of the first embodiment.
Figure 2B:
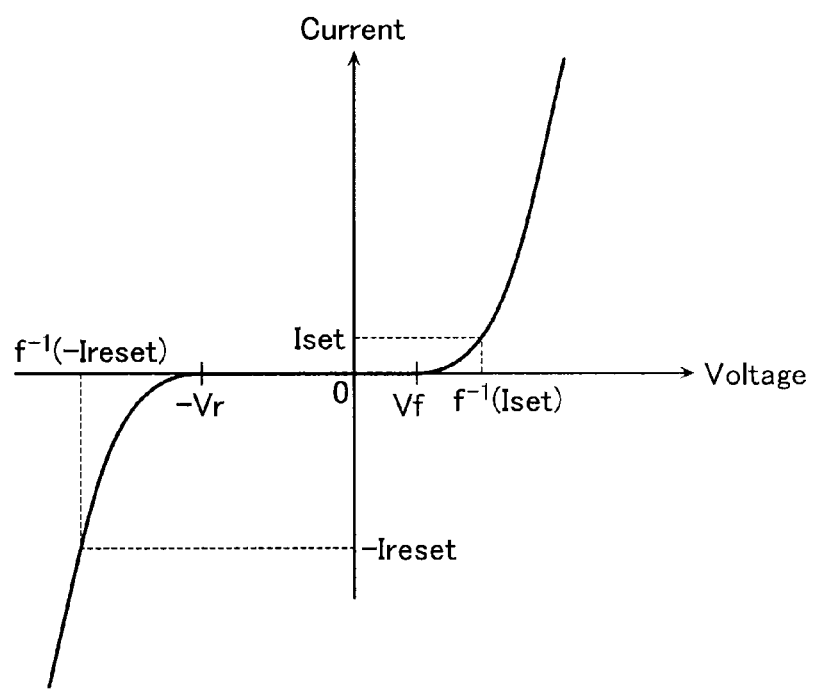
FIG. 2B shows one example of voltage-current characteristics of a bidirectional diode Di included in a memory cell.

FIG. 2A is a circuit diagram showing an equivalent circuit of the memory cell array MA in the resistance varying memory device. The memory cell array MA shown in FIG. 2A herein has, for example, $1\times10^3$ unit memory cells MC disposed in each of the longer direction of the word lines WL (x direction shown in FIG. 2A) and the longer direction of the bit lines BL (y direction shown in FIG. 2A). The unit memory cells MC within one memory cell array MA are arranged in a two-dimensional matrix. As shown in FIG. 2A, disposed at intersections of the word lines WL and bit lines BL are resistance varying type unit memory cells MC each having a rectifying element, for example, a bidirectional diode Di, and a variable resistance element VR connected in series. That is, each of the memory cells MC in this first embodiment is a bipolar type memory cell having a configuration capable of allowing a current to flow in both a forward direction and a reverse direction. An example of voltage-current characteristics of the bidirectional diode Di is shown in FIG. 2B.

The variable resistance element VR is one having a structure comprising, for example, electrode/transition metal oxide/electrode, or the like, and undergoes a change in resistance value of the metal oxide due to application conditions of a voltage, current, heat, and so on, to thereby store different states of that resistance value as information in a nonvolatile manner. More specifically, the following may be employed as this variable resistance element VR, namely: a phase change random access memory (PCRAM) element that has its resistance value changed by a phase transition between a crystalline state and an amorphous state in the manner of chalcogenide or the like; a conductive bridging random access memory (CBRAM) element that has its resistance value changed by depositing metal cations to form a bridge (contacting bridge) between electrodes, and ionizing the deposited metal to destroy the bridge; a resistive random access memory (ReRAM) element that changes its resistance value by application of a voltage or current (ReRAM elements are broadly divided into those in which resistance change occurs due to presence/absence of charge trapped in a charge trap existing in an electrode interface, and those in which resistance change occurs due to presence/absence of a conductive path induced by oxygen deficiency or the like); and so on.

In the case of bipolar type ReRAM, write of data to the memory cell MC applies a voltage of, for example, about 7 V to the variable resistance element VR in the reverse direction of the bidirectional diode Di (about 8V between the bit line BL and the word line WL, in view of a voltage drop in the bidirectional diode Di), and causes a current of about 10 nA to flow in the variable resistance element VR for a time of about 10 ns-100 ns. As a result, the variable resistance element VR changes from a high-resistance state to a low-resistance state. Hereafter, this operation for changing the variable resistance element VR from a high-resistance state to a low-resistance state is called a setting operation.

On the other hand, erase of data in the memory cell MC applies a voltage of, for example, about 7 V to the variable resistance element VR in the forward direction of the bidirectional diode Di (about 8 V between the bit line BL and the word line WL, in view of a voltage drop in the bidirectional diode Di), and causes a current of about 1 µA-10 µA to flow in the variable resistance element VR for a time of about 500 ns-2 µs. As a result, the variable resistance element VR changes from a low-resistance state to a high-resistance state. Hereafter, this operation for changing the variable resistance element VR from a low-resistance state to a high-resistance state is called a resetting operation.

A read operation of the memory cell MC provides a voltage of 0.4 V to the variable resistance element VR (about 1.4 V between the bit line BL and the word line WL, in view of a voltage drop in the bidirectional diode Di), and monitors a current flowing via the variable resistance element VR. As a result, it is judged whether the variable resistance element VR is in a low-resistance state or a high-resistance state.

Figure 3:
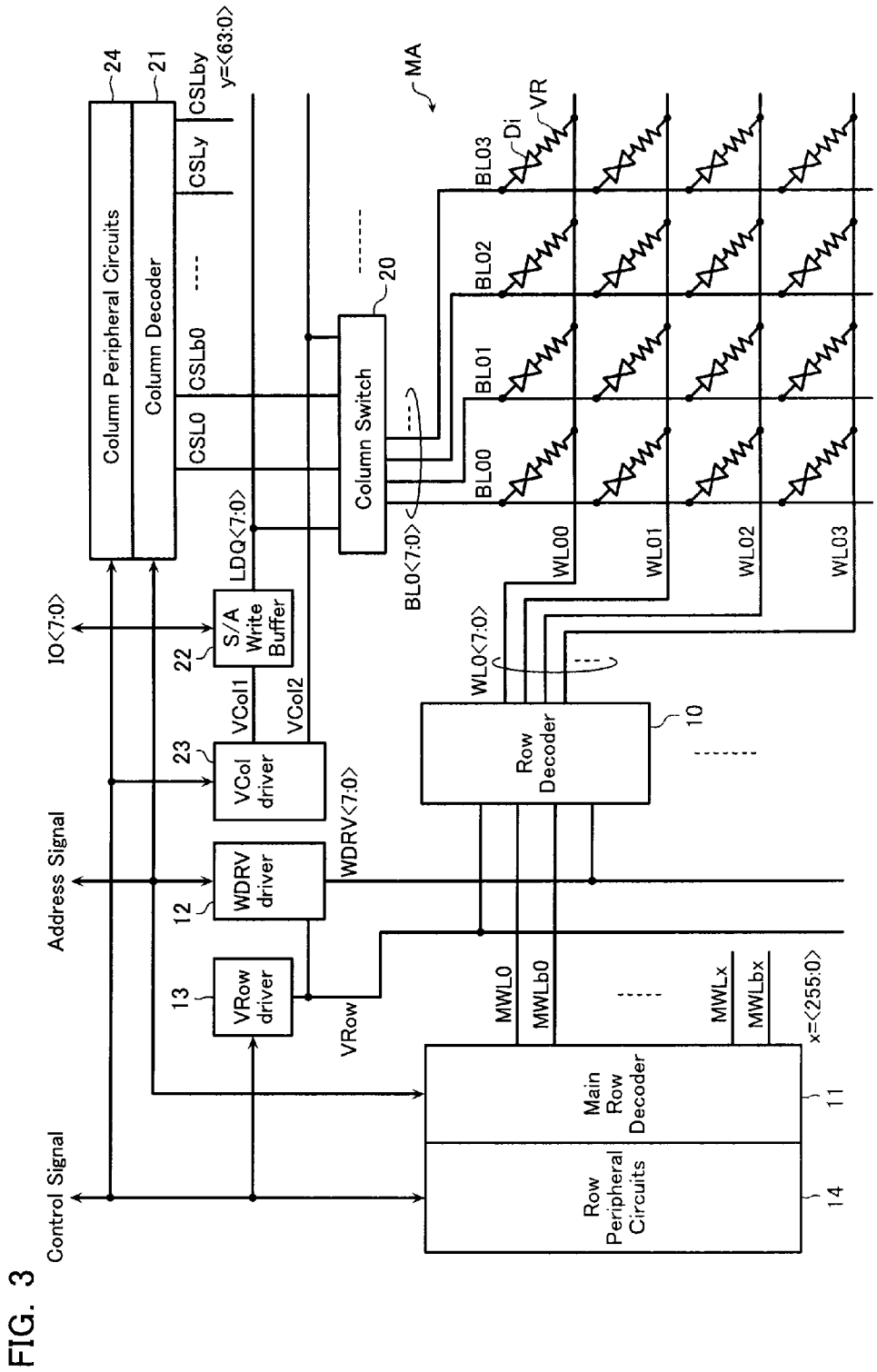
FIG. 3 is a block diagram showing an overall configuration of the semiconductor memory device in the first embodiment.

Next, configurations of the column system control circuit and the row system control circuit are described with reference to FIG. 3. Described as an example herein is the case where a 1 Mbit memory cell array MA is configured, the 1 Mbit memory cell array MA having 2 Kbit (=2048 bit) of memory cells MC arranged in the word line direction and 512 bit of memory cells MC arranged in the bit line direction. FIG. 3 is a block diagram showing a layout example of the column system control circuit and the row system control circuit in the resistance varying memory device.

As shown in FIG. 3, the row system control circuit is configured by, for example, a row decoder 10, a main row decoder 11, a write drive line driver 12, a row power line driver 13, and a row system peripheral circuit 14. Moreover, the column system control circuit is configured by, for example, a column switch 20, a column decoder 21, a sense amplifier/write buffer 22, a column power line driver 23, and a column system peripheral circuit 24.

The word lines according to the present embodiment have a hierarchical structure, and the main row decoder 11 selectively drives any one pair of 256 pairs of main word lines MWLx and MWLbx (x=<255:0>). As an example, in selected main word lines MWLx and MWLbx, the main word line MWLx is in an "H" state, and the main word line MWLbx is in an "L" state. Conversely, in non-selected main word lines MWLx and MWLbx, the main word line MWLx is in an "L" state, and the main word line MWLbx is in an "H" state. One pair of main word lines MWLx and MWLbx is connected to the row decoder 10, and the row decoder 10 selectively drives one of eight word lines WLx<7:0> in a hierarchical layer below the main word lines MWLx and MWLbx. The row decoder 10 which is connected to the main word lines MWLx and MWLbx that are selectively driven by the main row decoder 11 further selectively drives the word lines WL. This causes one word line WL to be selectively driven.

Eight write drive lines WDRV<7:0> and a row power line VRow are connected to the write drive line driver 12, and the row power line VRow is connected to the row power line driver 13. This row power line VRow is applied with voltages that are supplied to the word lines WL in a hierarchical layer below the non-selected main word lines MWLx and MWLbx and to the non-selected word lines WL in a hierarchical layer below the selected main word lines MWLx and MWLbx.

The write drive lines WDRV<7:0> and the row power line VRow are connected to the row decoder 10, and the row decoder 10 is applied with voltages for driving the word lines WL. The row system peripheral circuit 14 performs management of this entire resistance varying memory device, and receives control signals from an external host device to perform read, write, erase, management of data input/output, and so on.

The bit lines according to the present embodiment have a hierarchical structure, and the column decoder 21 selectively drives any one pair of 64 pairs of column select lines CSLy and CSLby (y=<63:0>). As an example, in selected column select lines CSLy and CSLby, the column select line CSLy is in an "H" state, and the column select line CSLby is in an "L" state. Conversely, in non-selected column select lines CSLy and CSLby, the column select line CSLy is in an "L" state, and the column select line CSLby is in an "H" state.

One pair of column select lines CSLy and CSLby is connected to the column switch 20, and the column switch 20 selectively drives one of eight bit lines BLy<7:0> in a hierarchical layer below the column select lines CSLy and CSLby. The column switch 20 which is connected to the column select lines CSLy and CSLby that are selectively driven by the column decoder 21 further selectively drives the bit lines BL. This causes one bit line BL to be selectively driven. The sense amplifier/write buffer 22 detects and amplifies signals read in local data lines LDQ<7:0> and supplies write data inputted from data input/output lines IO<7:0>, via the column switch 20, to the memory cells MC.

The eight local data lines LDQ<7:0> and a column power line VCol1 are connected to the sense amplifier/write buffer 22, and the column power line VCol1 and a column power line VCol2 are connected to the column power line driver 23. The local data lines LDQ<7:0> and the column power lines VCol1 and VCol2 are connected to the column switch 20, and the column switch 20 is applied with voltages for driving the bit lines BL. Specifically, during a setting operation, a voltage VSET is supplied to the one local data line LDQ of the eight local data lines LDQ<7:0> that corresponds to the selected bit line BL, and the other seven local data lines LDQ are supplied with a voltage Vα. The column system peripheral circuit 24 performs management of this entire resistance varying memory device, and receives control signals from the external host device to perform read, write, erase, management of data input/output, and so on.

Next, voltages applied to the word lines WL and bit lines BL when performing the resetting operation in the resistance varying memory device of the first embodiment are described with reference to FIGS. 4 and 5. First, applied voltages when executing the resetting operation in a resistance varying memory device according to a comparative example are described with reference to FIG. 4. Now, as an example, a selected memory cell MC having its data erased by the resetting operation is a memory cell MC03 positioned at an intersection of a selected bit line BL03 and a selected word line WL00

The bit line BL03 (selected bit line) and the word line WL00 (selected word line) connected to the selected memory cell MC03 are applied with, respectively, a resetting voltage $V_{RESET}$ and a ground voltage $V_{SS}$ (=0 V). As a result, the bidirectional diode Di in the selected memory cell MC03 attains a forward direction bias state whereby a current flows, and the variable resistance element VR in the selected memory cell MC03 changes from a low-resistance state to a high-resistance state, whereby the resetting operation is completed. The resetting voltage $V_{RESET}$ is, for example, about 8 V, but this changes according to characteristics of the bidirectional diode Di and the variable resistance element VR, and parasitic resistance of the word lines WL and bit lines BL, characteristics of other peripheral circuits, and so on.

On the other hand, non-selected bit lines BL00, BL01, and BL02 not connected to the selected memory cell MC03 on the memory cell array MA are applied with the ground voltage $V_{SS}$. Moreover, non-selected word lines WL01, WL02, and WL03 not connected to the selected memory cell MC03 on the memory cell array MA are applied with the resetting voltage $V_{RESET}$.

Hereafter, the memory cell MC03 connected to the intersection of the selected word line WL00 and the selected bit line BL03 and surrounded by broken line M1 is referred to below as being in a selected state. The memory cell MC03 in a selected state is applied with a voltage in the forward direction of the bidirectional diode Di from the bit line BL03 (voltage $V_{RESET}$) to the word line WL00 (voltage $V_{SS}$), whereby a resetting current flows in the memory cell MC03. This current causes the resetting operation to be performed on the memory cell MC03.

Meanwhile, the memory cells MC connected to intersections of the selected bit line BL03 and the non-selected word lines WL01-WL03 and surrounded by broken line M2 are referred to as being in a "half-selected state". The memory cells in a half-selected state are not applied with a voltage. Similarly, the memory cells MC connected to intersections of the selected word line WL00 and the non-selected bit lines BL00-BL02 and surrounded by broken line M3 are also in a half-selected state, and similarly not applied with a voltage.

Moreover, the memory cells MC connected to intersections of the non-selected word lines WL01-WL03 and the non-selected bit lines BL00-BL02 and surrounded by broken line M4 are referred to below as being in a non-selected state. The non-selected memory cells MC in a non-selected state are applied with a reverse bias ($-V_{RESET}$), whereby a leak current flows in the non-selected memory cells MC. If the number of memory cells MC included in the memory cell array MA increases and the number of non-selected memory cells MC increases, then increase in the leak current can no longer be ignored. There is a risk that this increase in the leak current gives rise to an increase in power consumption, incorrect operation due to reduction in operation margin, and so on.

Figure 5:
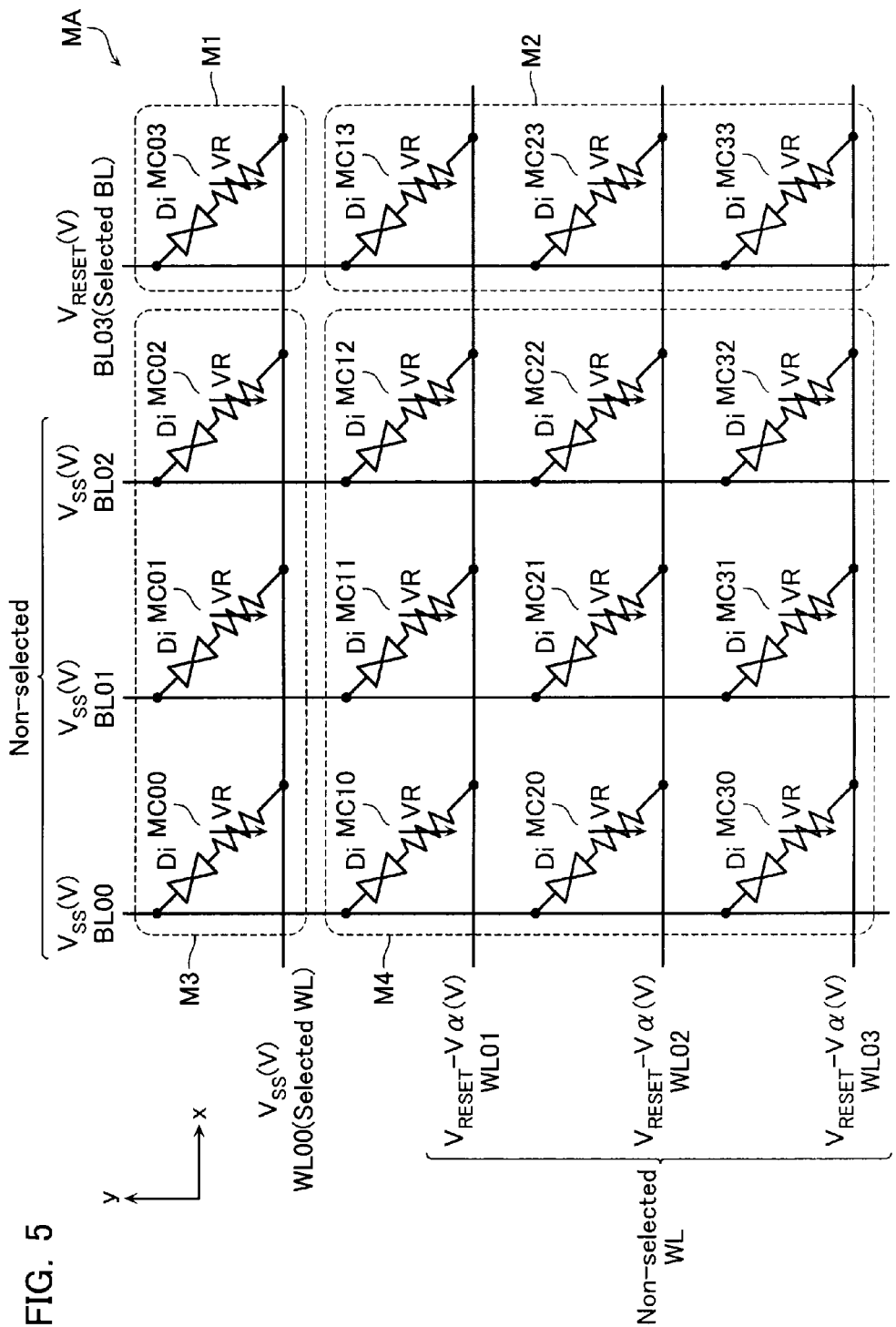
FIG. 5 shows voltages applied to word lines WL and bit lines BL in a resetting operation in the semiconductor memory device of the first embodiment.

Accordingly, in the present embodiment, as shown in FIG. 5, increase in leak current is suppressed by executing the following voltage application method.

The selected bit line BL03 (selected bit line) and the selected word line WL00 (selected word line) are applied with, respectively, the voltage $V_{RESET}$ and the ground voltage $V_{SS}$ (=0 V). In addition, the non-selected bit lines BL00, BL01, and BL02 are applied with the ground voltage $V_{SS}$. This is similar to FIG. 4.

On the other hand, the non-selected word lines WL01-WL03 are applied with a voltage ($V_{RESET}$–Vα) equal to the resetting voltage $V_{RESET}$ subtracted by an offset voltage.

As a result, in the case of this FIG. 5, the offset voltage Vα is applied also to the memory cells MC in broken line M2 in a half-selected state. The memory cells MC in broken line M3 in a half-selected state are not applied with a voltage, similarly to in FIG. 4.

Figure 4:
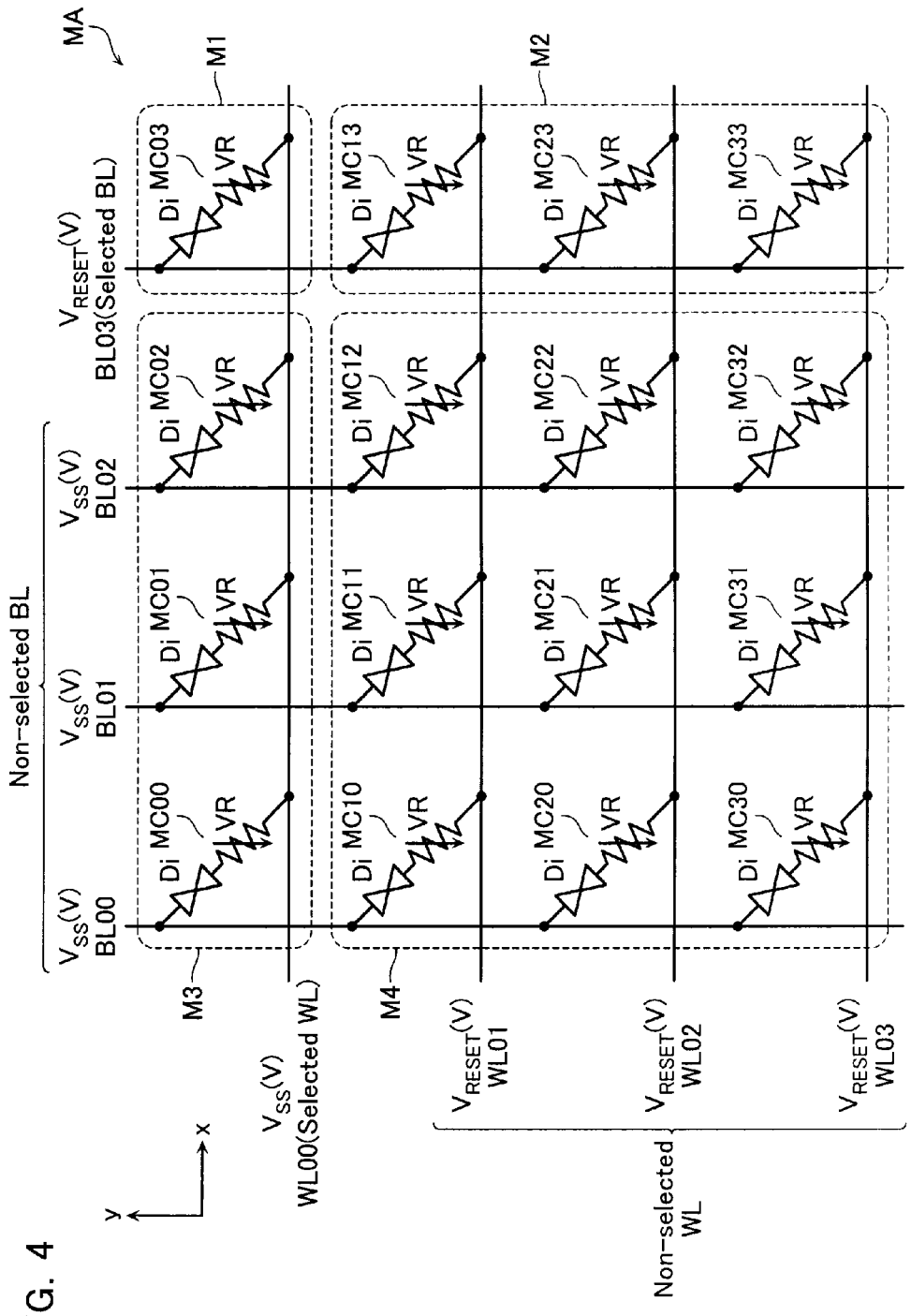
FIG. 4 shows applied voltages applied to word lines WL and bit lines BL in a resetting operation in a semiconductor memory device according to a comparative example.

On the other hand, the memory cells MC in a non-selected state (in broken line M4) are applied with a reverse bias (–$V_{RESET}$+Vα) which is smaller than that in the case of FIG. 4 by an amount of the offset voltage Vα. That is, in the case of FIG. 5, a potential difference (absolute value) between the voltage applied to the non-selected bit lines BL and the voltage applied to the non-selected word lines WL is smaller than a potential difference (absolute value) between the voltage applied to the selected bit line BL and the voltage applied to the selected word line WL by an amount of the offset voltage Vα. Having such an offset voltage Vα being set allows a total amount of leak current flowing in the plurality of memory cells MC in a non-selected state (in broken line M4) to be reduced compared to in the case of FIG. 4. There are a large number of memory cells in a non-selected state (in broken line M4), hence reducing the leak current in these memory cells MC in anon-selected state (in broken line M4) leads to leak current in the entire memory device being reduced. Therefore, this voltage application method of FIG. 5 allows leak current to be suppressed and power consumption to be reduced.

Incidentally, when performing the resetting operation in the resistance varying memory, it is general to perform a so-called step-up operation. For example, the resetting voltage $V_{RESET}$ is set to an initial value $V_{RESET0}$ and a resetting operation is performed. If the erase operation is not completed as a result of this resetting operation, the resetting operation is performed again by a voltage ($V_{RESET0}$+ΔV) which is equal to the initial value $V_{RESET0}$ added by a step-up voltage ΔV. Thereafter, similar step-up operations are repeated until the resetting operation is completed.

Figure 6A:
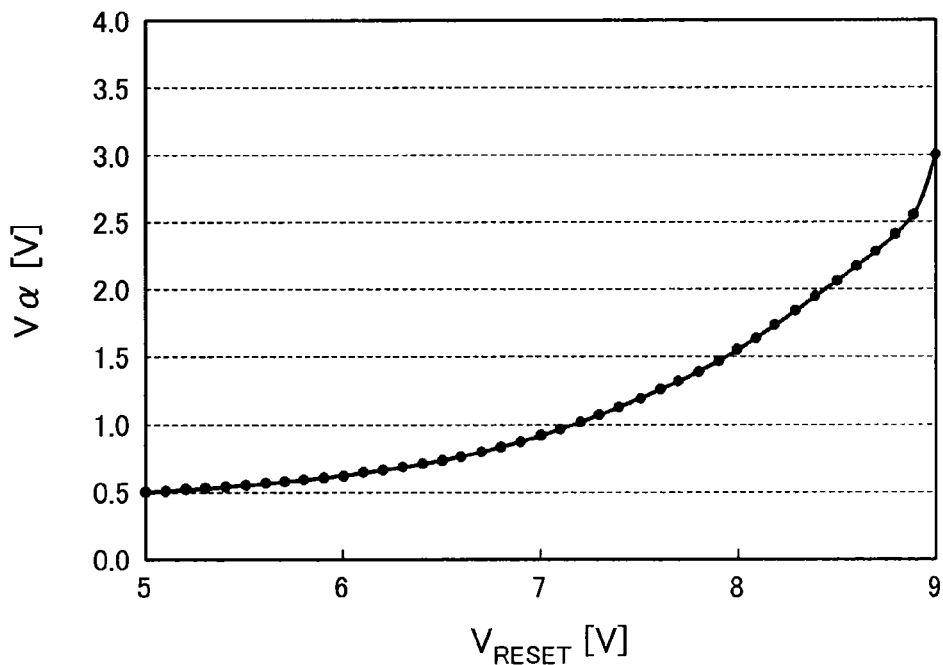
FIG. 6A shows a relationship between an offset voltage $V\alpha$ and a resetting voltage $V_{RESET}$.

In the present embodiment, as shown in FIG. 6A, as the voltage $V_{RESET}$ (potential difference (absolute value) between the voltage applied to the selected bit line BL and the voltage applied to the selected word line WL) increases due to such a step-up operation or for other reasons, this offset voltage Vα also changes to a large value. In FIG. 6A, as the voltage $V_{RESET}$ (difference (absolute value) between the voltage applied to the selected bit line BL03 and the voltage applied to the selected word line WL00) gradually increases, the offset voltage Vα is increasing quadratically (non-linearly, or in a curved manner). However, this is merely one example. The voltage Vα may increase linearly (in accordance with a linear function) as the voltage $V_{RESET}$ increases. Moreover, the voltage Vα may increase in a stepwise manner (the voltage Vα may be constant when the voltage $V_{RESET}$ is within a certain numerical range).

Figure 6B:
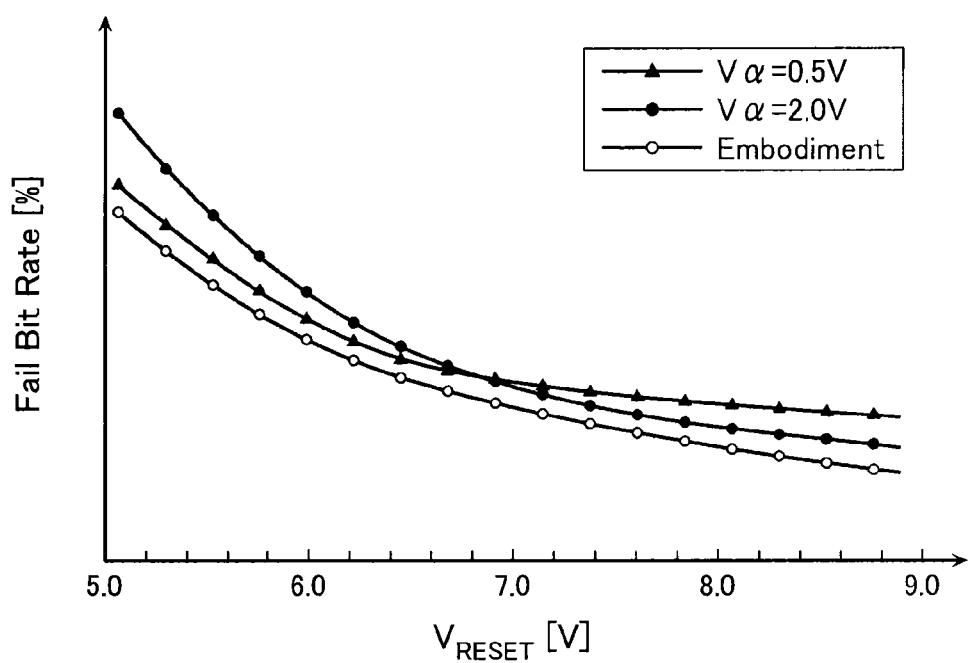
FIG. 6B is a graph showing reasons for changing the offset voltage $V\alpha$.

The reason for increasing the offset voltage Vα in this way is described with reference to FIG. 6B. FIG. 6B is a graph showing a relationship between a value of the voltage $V_{RESET}$ and a probability that the resetting operation at that time is not completed but is a "FAIL" (fail bit rate). In FIG. 6B, the black triangle dots show the case where the offset voltage Vα is fixed at 0.5 V, and the black circle dots show the case where the offset voltage Vα is fixed at 2.0 V. In both cases, the more the value of the voltage $V_{RESET}$ increases, the more the fail bit rate lowers (resetting operation advances).

However, when the value of the voltage $V_{RESET}$ is comparatively small (in FIG. 6B, when $V_{RESET}$ is less than 7.0 V), the fail bit rate is smaller in the case that the offset voltage Vα is 0.5 V than in the case that the offset voltage Vα is 2.0 V. On the other hand, when the value of the voltage $V_{RESET}$ is comparatively large (in FIG. 6B, when $V_{RESET}$ is 7.0 V or more), the fail bit rate is smaller in the case that the offset voltage Vα is 2.0 V than in the case that the offset voltage Vα is 0.5 V. Such a phenomenon is thought to occur for the following reason. If the voltage Vα is set to a large value such as 2.0 V when the voltage $V_{RESET}$ is small, while there is no effect on leak current in memory cells in a non-selected state, leak current in memory cells in a half-selected state (in broken line M2) increases. Therefore, when the voltage $V_{RESET}$ is small, the fail bit rate becomes smaller in the case where the voltage Vα is set to 0.5 V compared to the case where the voltage Vα is set to 2.0 V.

On the other hand, when the voltage $V_{RESET}$ is large, the effect of leak current in memory cells in a non-selected state (in broken line M4) is great. Therefore, setting the value of the voltage Vα to a large value is desirable for reducing the leak current. Reducing the leak current leads to suppressing a change in potential of the selected bit line BL or selected word line WL and also allows the fail bit rate to be reduced.

Focusing on this point, the present embodiment performs control for gradually increasing the offset voltage Vα as the voltage $V_{RESET}$ (voltage applied between the selected bit line BL and the selected word line WL) increases. As an example, as shown in FIG. 6A, when the voltage $V_{RESET}$ is 5.0 V, the voltage Vα is set to about 0.5 V. On the other hand, when the voltage $V_{RESET}$ is 9.0 V, the voltage Vα is set to about 3.0 V. When the voltage $V_{RESET}$ is such that 5.0 V<$V_{RESET}$<9.0 V, the voltage Vα is increased in a range of 0.5 V to 3.0 V in accordance with increase in the voltage $V_{RESET}$. As shown in FIG. 6B, setting the offset voltage Vα to a variable value in this way allows the fail bit rate to be lowered along an entirety of a variable range of the voltage $V_{RESET}$. Therefore, the resetting operation can be completed promptly and increase in power consumption can be suppressed.

Figure 7:
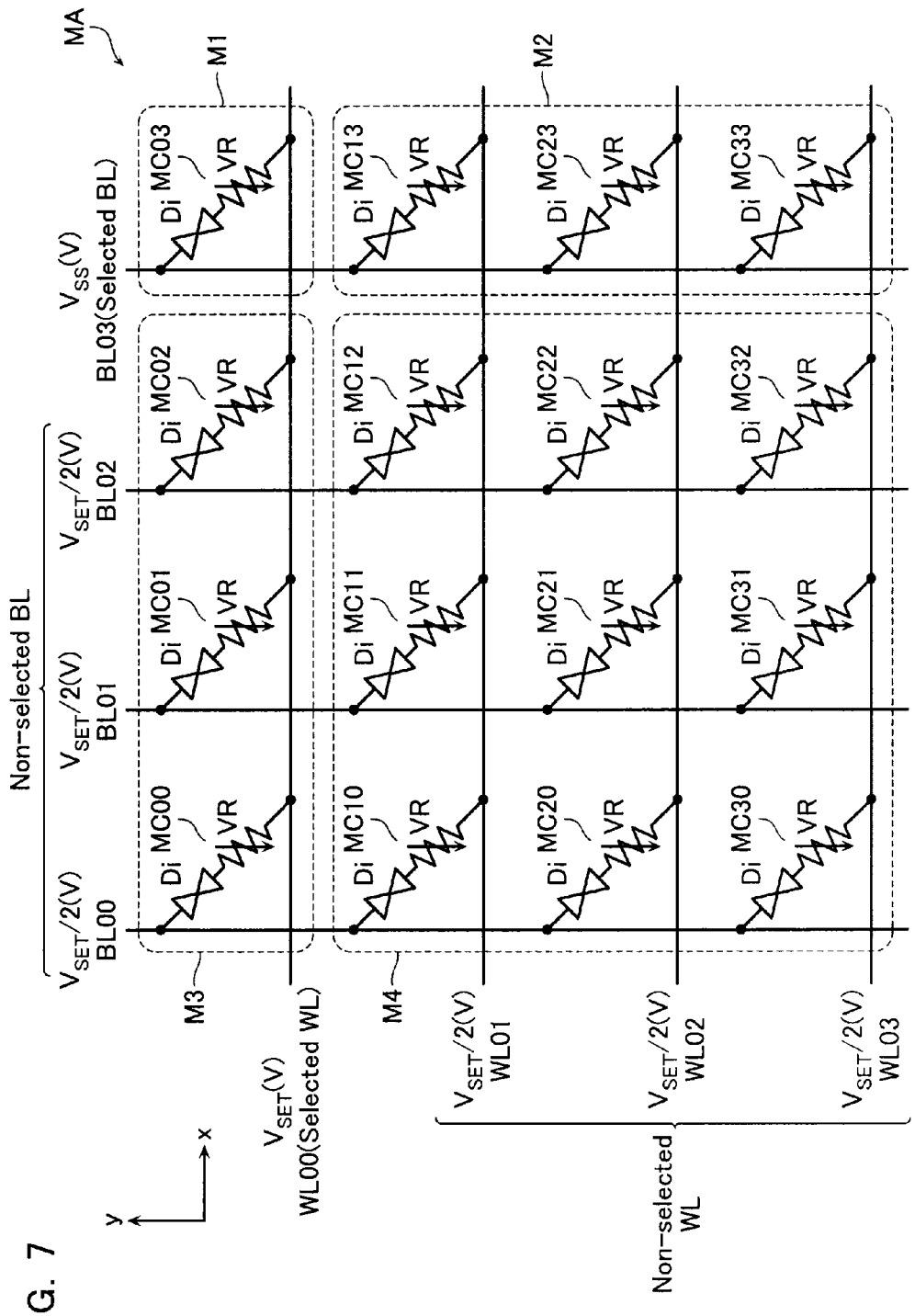
FIG. 7 shows voltages applied to the word lines WL and bit lines BL in a setting operation in the semiconductor memory device of the first embodiment.

Next, a setting operation in the first embodiment is described with reference to FIG. 7. Here also, description proceeds assuming the selected memory cell to be memory cell MC03.

In this case, the selected bit line BL03 (selected bit line) and the word line WL00 (selected word line) are applied with, respectively, the ground voltage $V_{SS}$ and a setting voltage $V_{SET}$. In addition, the non-selected bit lines BL00-BL02 and the non-selected word lines WL01-WL03 are applied with $V_{SET}/2$ which is a voltage that is half of the setting voltage $V_{SET}$ (that is, a voltage intermediate between the voltage $V_{SET}$ applied to the selected bit line BL03 and the voltage $V_{SS}$ applied to the selected word line WL). Thus, in the setting operation, the offset voltage Vα of the kind employed during the resetting operation is not employed.

Note that, similarly to conventionally, a read operation of the memory cells MC (read operation) can be performed by applying a voltage Vread which is smaller than the above-mentioned setting voltage $V_{SET}$ or resetting voltage $V_{RESET}$ to a selected memory cell MC, thereby detecting a current flowing in the selected memory cell MC.

[Advantages]

As described above, in the semiconductor memory device of the first embodiment, setting of the offset voltage Vα results in the reverse bias applied to the memory cells in a non-selected state being set to an appropriate value in accordance with the voltage applied between the selected bit line BL and the selected word line WL. This allows power consumption to be reduced.

[Modified Example of First Embodiment]

Figure 8:
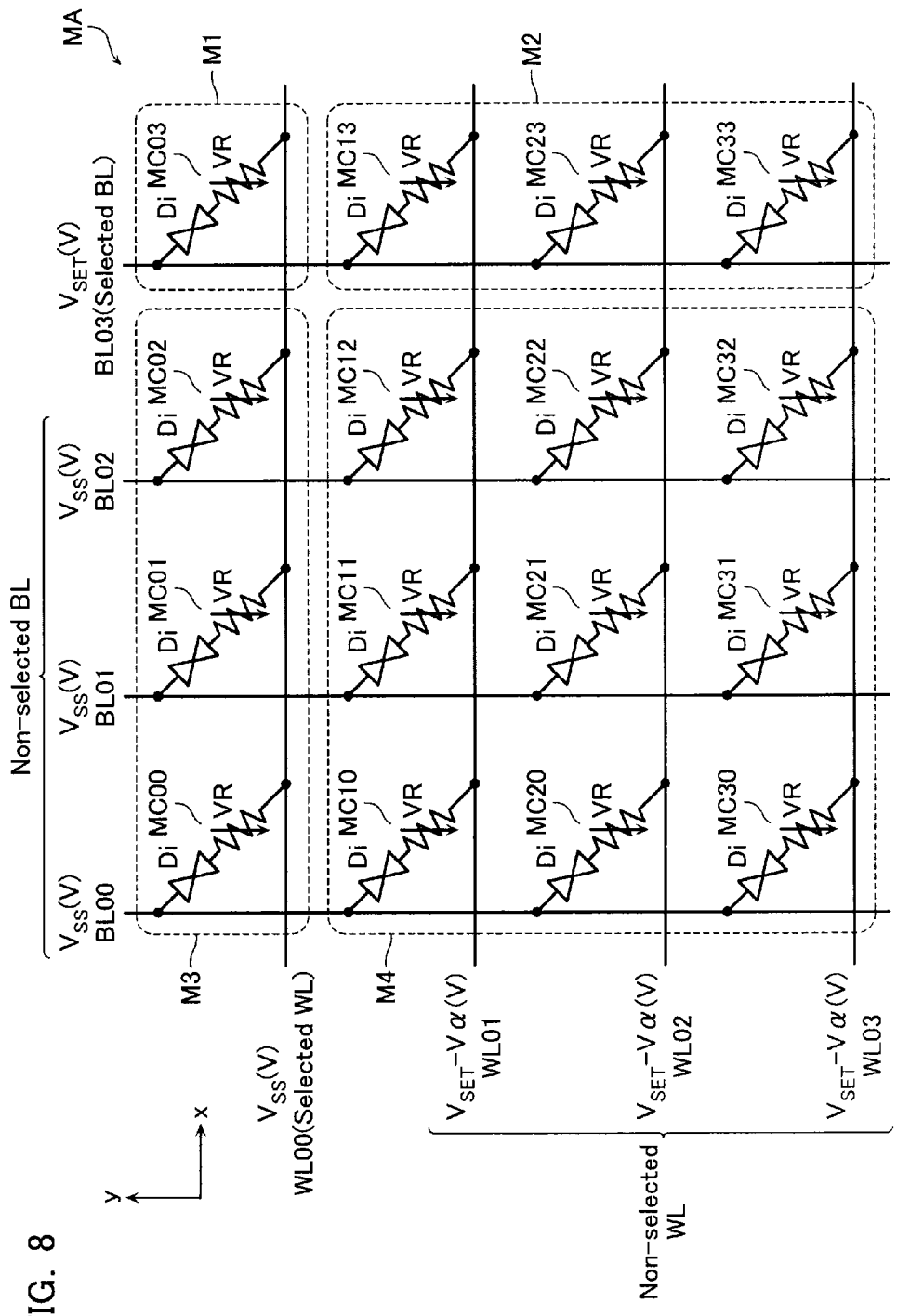
FIG. 8 shows a modified example of the semiconductor memory device in the first embodiment.
Figure 9:
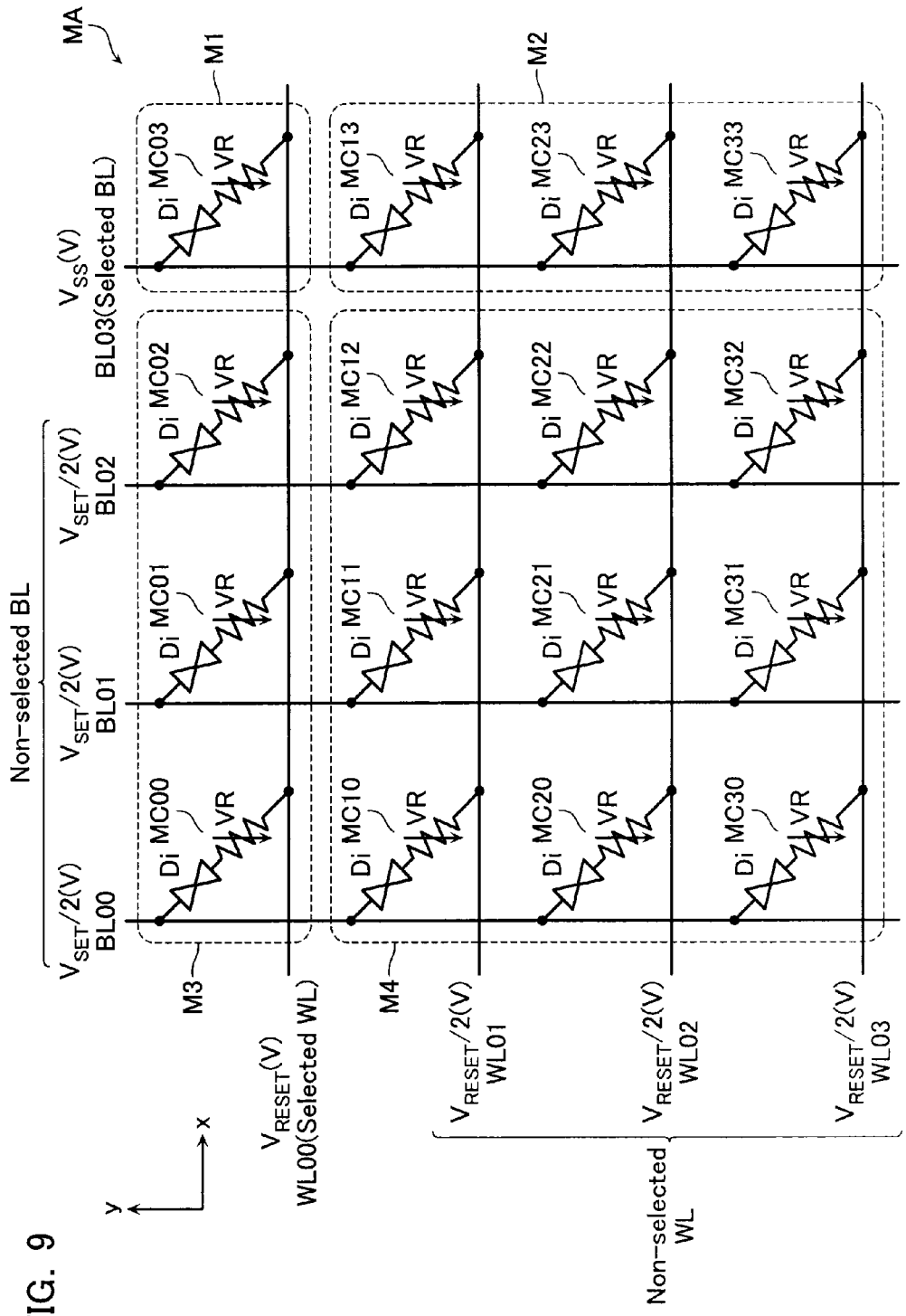
FIG. 9 shows a modified example of the semiconductor memory device in the first embodiment.

FIG. 8 shows a modified example of the first embodiment. FIGS. 5 and 7 described a voltage application method that, during a resetting operation, performs adjustment of an applied voltage by an offset voltage Vα and, during a setting operation, applies a voltage $V_{SET}/2$ to non-selected word lines WL and non-selected bit lines hence does not require adjustment by the offset voltage Vα. Contrary to this, as shown in FIGS. 7 and 8, it is also possible to adopt a voltage application method that, during a setting operation, performs adjustment of an applied voltage by an offset voltage Vα and, during a resetting operation, applies a voltage $V_{RESET}/2$ to non-selected word lines WL and non-selected bit lines thereby not performing adjustment by the offset voltage Vα. In other words, in the first embodiment, it is possible to adopt a voltage application method of a kind that performs adjustment by an offset voltage Vα when performing either one of the setting operation or the resetting operation on the memory cell MC, and does not perform such adjustment when performing the other of the operations.

[Second Embodiment]

Figure 10:
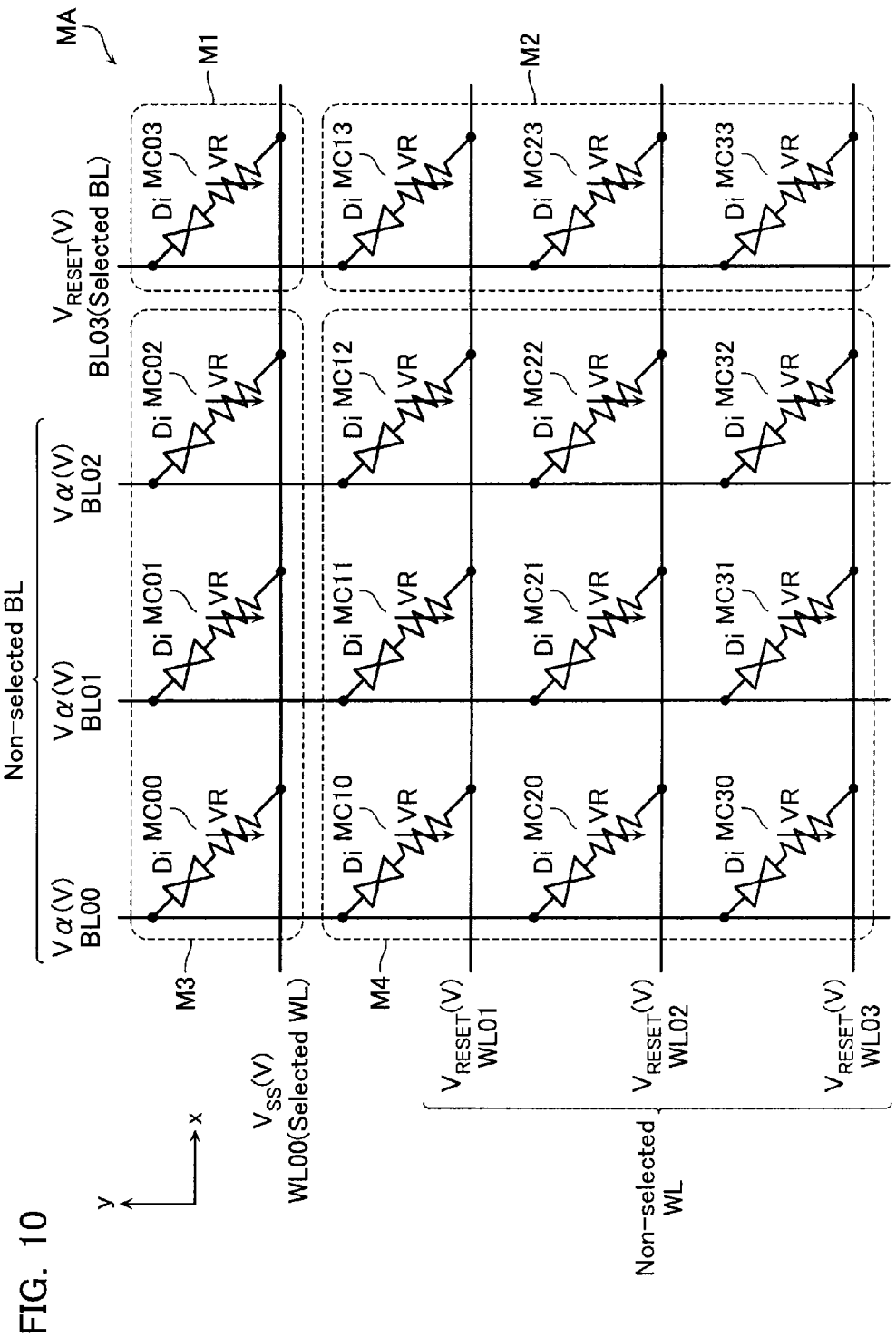
FIG. 10 shows voltages applied to word lines WL and bit lines BL in a resetting operation in a semiconductor memory device of a second embodiment.

Next, a semiconductor memory device according to a second embodiment is described with reference to FIG. 10. A configuration of this semiconductor memory device according to the second embodiment is similar to that in FIGS. 1-3. However, in this embodiment, voltages applied to the non-selected bit lines BL and the non-selected wordlines WL during the resetting operation differ from those in the first embodiment. This second embodiment differs from the first embodiment in having the voltage applied to the non-selected word lines WL01-WL03 set to $V_{RESET}$, and the voltage applied to the non-selected bit lines BL00-BL02 set to the offset voltage Vα. In addition, a value of this offset voltage Vα is changed similarly to in the first embodiment. Note that applied voltages during the setting operation may be identical to those in the first embodiment. This second embodiment allows similar advantages to those in the first embodiment to be displayed.

[Third Embodiment]

Figure 11:
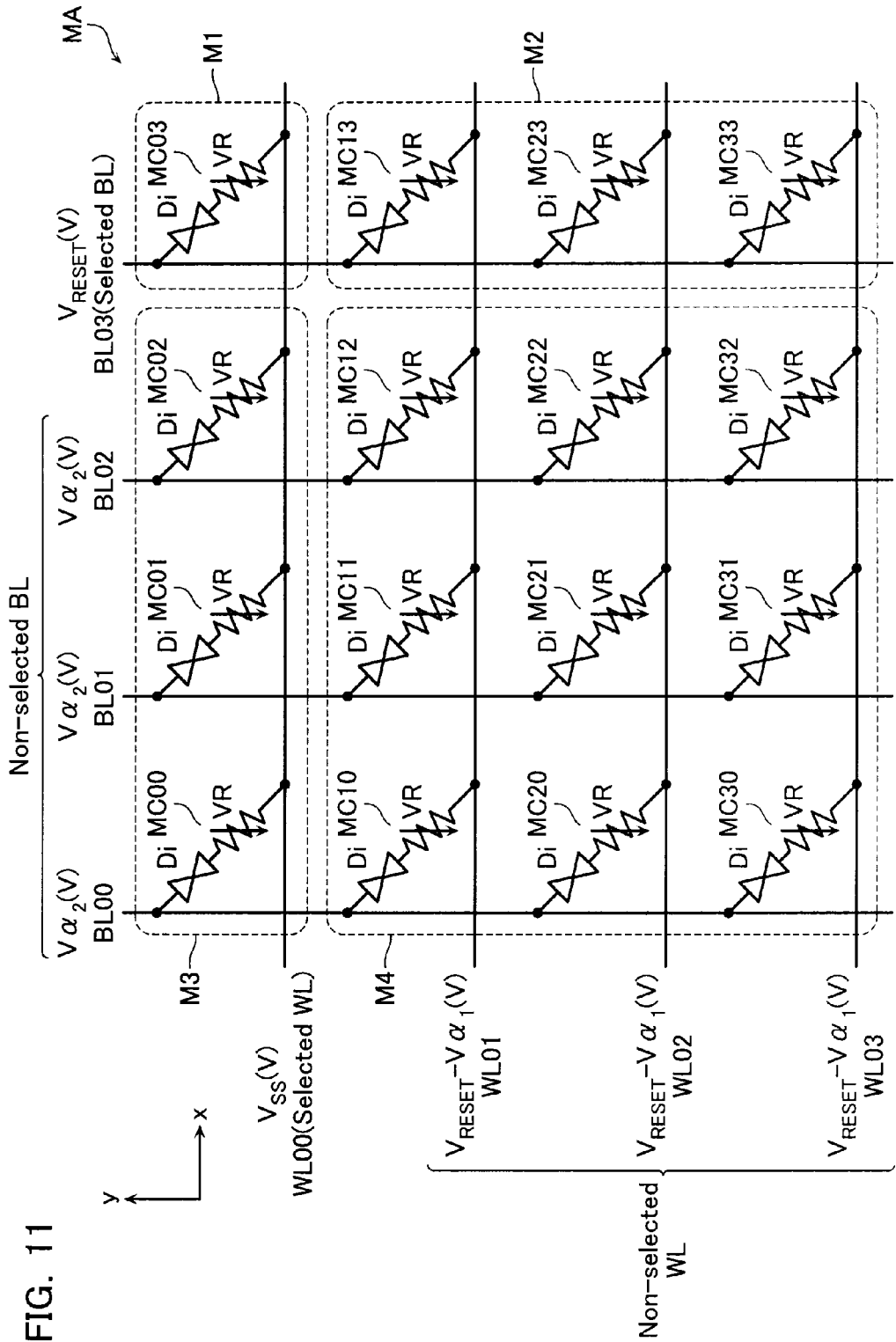
FIG. 11 shows voltages applied to word lines WL and bit lines BL in a resetting operation in a semiconductor memory device of a third embodiment.

Next, a semiconductor memory device according to a third embodiment is described with reference to FIG. 11. A configuration of this semiconductor memory device according to the third embodiment is similar to that in FIGS. 1-3. However, in this embodiment, voltages applied to the non-selected bit lines BL and the non-selected word lines WL during the resetting operation differ from those in the first embodiment. This third embodiment differs from the first embodiment in having the voltage applied to the non-selected word lines WL01-WL03 set to $V_{RESET}-V\alpha_1$ and the voltage applied to the non-selected bit lines BL00-BL02 set to an offset voltage $V\alpha_2$. A sum of the offset voltages $V\alpha_1$ and $V\alpha_2$ is equal to the offset voltage Vα (FIG. 5). In addition, this sum of the offset voltages $V\alpha_1$ and $V\alpha_2$ is changed similarly to in the first embodiment. Note that applied voltages during the setting operation may be identical to those in the first embodiment. This third embodiment allows similar advantages to those in the first embodiment to be displayed.

[Fourth Embodiment]

Figure 12:
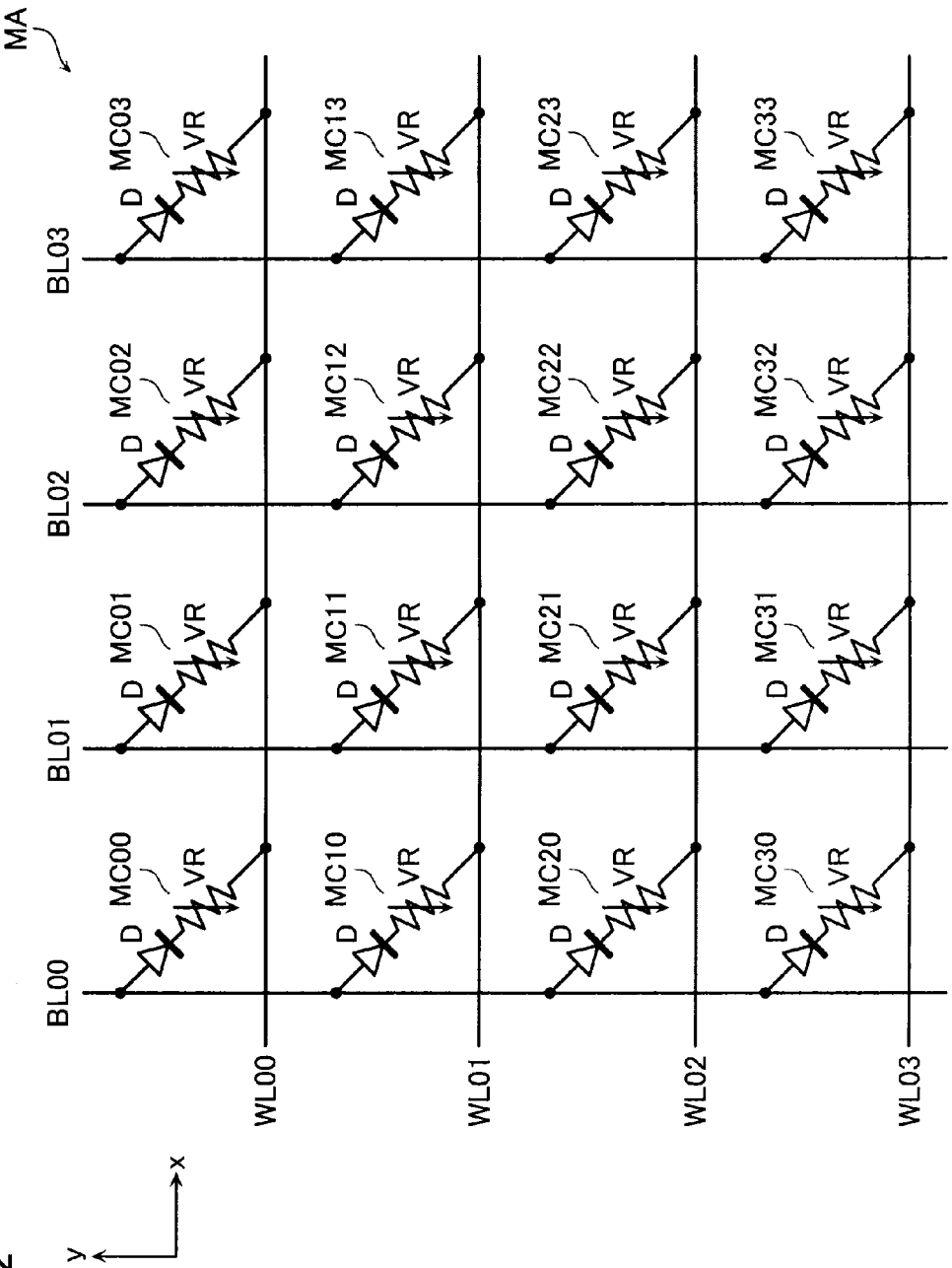
FIG. 12 is an equivalent circuit diagram of a memory cell array in a semiconductor memory device of a fourth embodiment.

Next, a semiconductor memory device according to a fourth embodiment is described with reference to FIGS. 12-14. A configuration of a memory cell array MA in this embodiment is shown in FIG. 12. This embodiment differs from the first through third embodiments in employing a diode D (unidirectional diode) in place of the bidirectional diode Di as a configurative element of a memory cell, the diode D allowing current to flow from its anode toward its cathode only when an applied voltage is forward bias and when the applied voltage is reverse bias not allowing current to flow. That is, the present embodiment relates to a resistance varying memory having a so-called unipolar operation system.

In the resistance varying memory having the unipolar operation system, the setting operation and the resetting operation are both performed by applying voltages in the forward bias direction of the diode D. However, the resetting voltage $V_{RESET}$ during the resetting operation has a smaller voltage value and longer application time than the setting voltage $V_{SET}$ during the setting operation.

Figure 13:
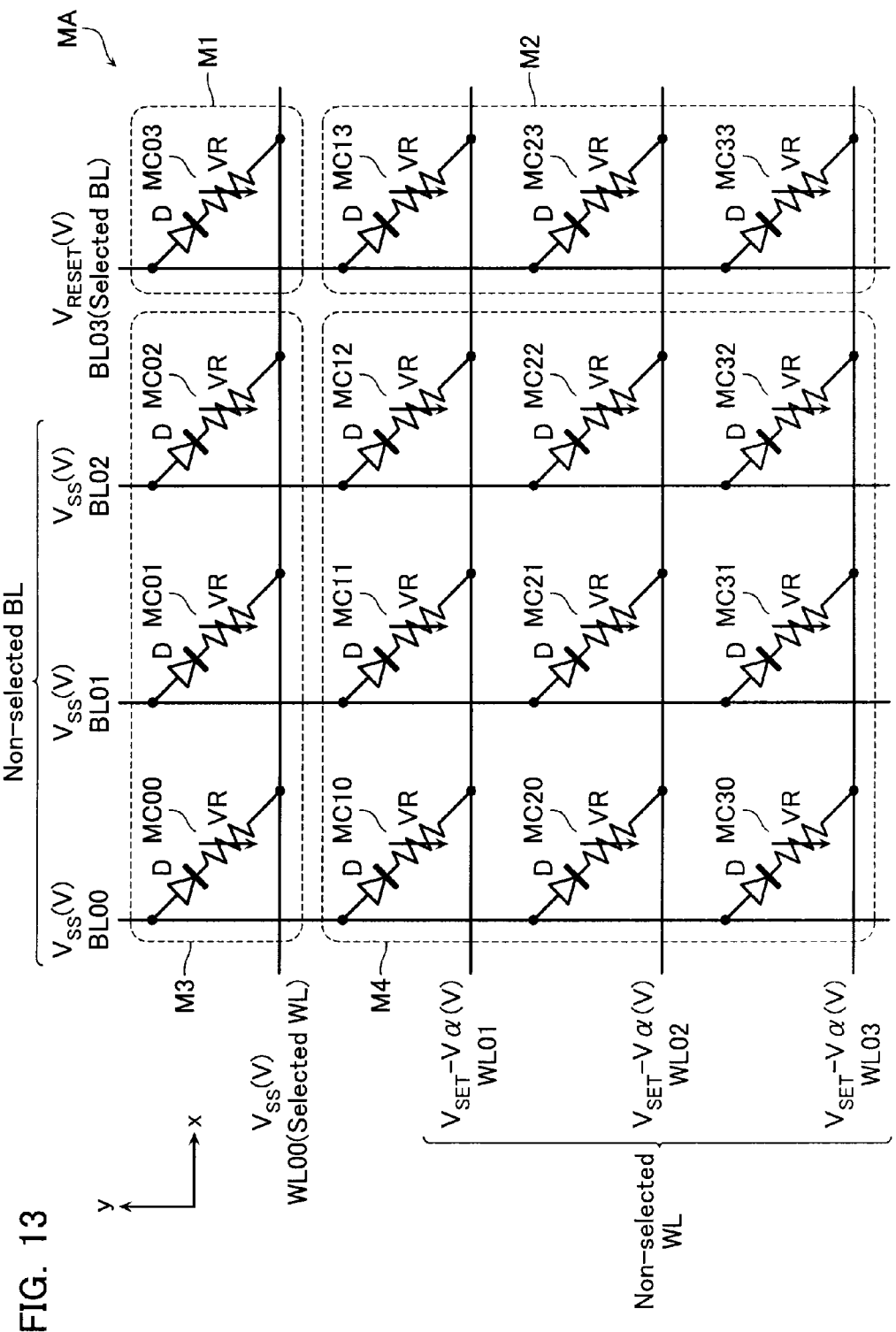
FIG. 13 shows voltages applied to word lines WL and bit lines BL in a resetting operation in the semiconductor memory device of the fourth embodiment.

FIG. 13 shows voltages applied to the word lines WL and bit lines BL when executing the resetting operation in the resistance varying memory device of the present embodiment. The selected bit line BL03 (selected bit line) and the word line WL00 (selected word line) are applied with, respectively, the resetting voltage $V_{RESET}$ and the ground voltage $V_{SS}$ (=0 V). In addition, the non-selected bit lines BL00, BL01, and BL02 are applied with the ground voltage $V_{SS}$. On the other hand, the non-selected word lines WL01, WL02, and WL03 are applied with a voltage ($V_{RESET}-V\alpha$) which is the resetting voltage $V_{RESET}$ from which the offset voltage Vα is subtracted. As a result, the memory cells MC in a half-selected state in broken line M2 are also applied with the offset voltage Vα. The memory cells MC in a half-selected state in broken line M3 are not applied with a voltage. Similarly to in the above-described embodiments, this offset voltage Vα is controlled to increase as the voltage applied to the selected memory cell MC03 increases.

Figure 14:
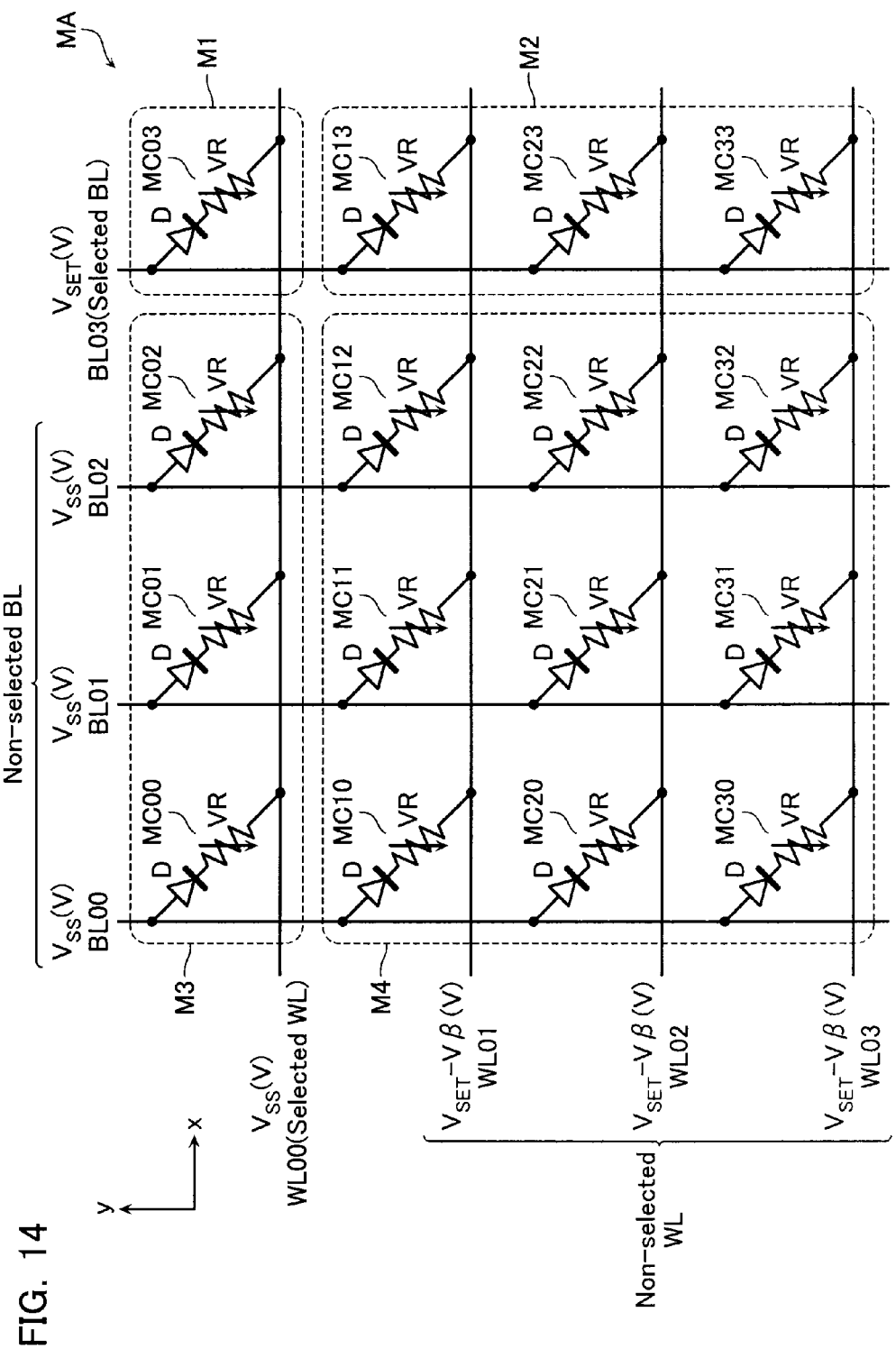
FIG. 14 shows voltages applied to the word lines WL and bit lines BL in a setting operation in the semiconductor memory device of the fourth embodiment.

FIG. 14 shows voltages applied to the word lines WL and bit lines BL when executing the setting operation in the resistance varying memory device of the present embodiment. The selected bit line BL03 (selected bit line) and the word line WL00 (selected word line) are applied with, respectively, the setting voltage $V_{SET}$ and the ground voltage $V_{SS}$ (=0 V). In addition, the non-selected bit lines BL00, BL01, and BL02 are applied with the ground voltage $V_{SS}$. On the other hand, the non-selected word lines WL01, WL02, and WL03 are applied with a voltage ($V_{SET}-V\beta$) which is the setting voltage $V_{SET}$ from which an offset voltage Vβ is subtracted. When the setting voltage $V_{SET}$ has a value greater than that of the resetting voltage $V_{RESET}$, the offset voltage Vβ attains a value greater than that of the offset voltage Vα in FIG. 13.

On the other hand, the non-selected memory cells MC (in broken line M4) are applied with a reverse bias ($-V_{SET}+V\beta$). Similarly to in the above-described embodiments, having such an offset voltage Vβ being set allows a total amount of leak current to be reduced. Similarly to in the above-described embodiments, this offset voltage Vβ is controlled to increase as the voltage applied to the selected memory cell MC03 increases.

As described above, the resistance varying memory device in the fourth embodiment, although executing unipolar operations, can display similar advantages to those of the first through third embodiments. In addition, since the operations are unipolar, it is effective to set the offset voltages Vα and Vβ in either of the setting operation and resetting operation. Note that a voltage application method of the kind in the second or third embodiments can be adopted for voltages applied to the non-selected word lines WL and non-selected bit lines BL.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a memory cell array including memory cells that are disposed at intersections of first lines and second lines, and the memory cells having a variable resistance element; and
a control circuit,
the control circuit being configured to, when performing a setting operation or resetting operation to a selected memory cell selected from among the memory cells, apply a first voltage to a selected first line connected to the selected memory cell, apply a second voltage to a selected second line connected to the selected memory cell, apply a third voltage to a non-selected first line other than the selected first line, and apply a fourth voltage which is larger than the third voltage to a non-selected second line other than the selected second line,
a first absolute value of a difference between the third voltage and the fourth voltage being set smaller than a second absolute value of a difference between the first voltage and the second voltage by an offset voltage, and
the control circuit being configured to increase the offset voltage as the second absolute value increases.

2. The semiconductor memory device according to claim 1, wherein
the control circuit is configured to, when performing either one of the setting operation or the resetting operation, apply the third voltage to the non-selected first line and apply the fourth voltage to the non-selected second line, and
the control circuit is configured to, when performing the remaining other of the setting operation or the resetting operation, apply a fifth voltage having a value between the first voltage and the second voltage to the non-selected first line and the non-selected second line.

3. The semiconductor memory device according to claim 1, wherein the offset voltage increases quadratically as the second absolute value increases.

4. The semiconductor memory device according to claim 1, wherein
the third voltage is equal to the second voltage, and
the fourth voltage has a value obtained by subtracting the offset voltage from the first voltage.

5. The semiconductor memory device according to claim 1, wherein
the fourth voltage is equal to the first voltage, and
the third voltage is equal to the offset voltage.

6. The semiconductor memory device according to claim 1, wherein
the third voltage is smaller than the offset voltage,
the fourth voltage has a value obtained by subtracting a value of a sixth voltage which is smaller than the offset voltage from a value of the first voltage, and
the offset voltage is a sum of the sixth voltage and the third voltage.

7. The semiconductor memory device according to claim 2, wherein the offset voltage increases quadratically as the second absolute value increases.

8. The semiconductor memory device according to claim 7, wherein
the third voltage is equal to the second voltage, and
the fourth voltage has a value obtained by subtracting the offset voltage from the first voltage.

9. The semiconductor memory device according to claim 7, wherein
the fourth voltage is equal to the first voltage, and
the third voltage is equal to the offset voltage.

10. The semiconductor memory device according to claim 1, wherein
the control circuit is configured to, when performing the setting operation and the resetting operation, apply the third voltage to the non-selected first line and apply the fourth voltage to the non-selected second line.

11. The semiconductor memory device according to claim 10, wherein the offset voltage increases quadratically as the second absolute value increases.

12. The semiconductor memory device according to claim 10, wherein
the third voltage is equal to the second voltage, and
the fourth voltage has a value obtained by subtracting the offset voltage from the first voltage.

13. The semiconductor memory device according to claim 10, wherein
the memory cells have rectifying element connected to the variable resistance element in series, and the rectifying element is a unidirectional diode, and
the rectifying element is a unidirectional diode, and
the control circuit is configured to, in both cases of performing the setting operation and of performing the resetting operation, control such that a forward direction voltage is applied to the unidirectional diode.

14. A semiconductor memory device, comprising
a memory cell array including memory cells that are disposed at intersections of first lines and second lines, and the memory cells having a variable resistance element; and
a control circuit,
the control circuit being configured to, when performing a setting operation or resetting operation to a selected memory cell selected from among the memory cells, apply a first voltage to a selected first line connected to the selected memory cell, apply a second voltage to a selected second line connected to the selected memory cell, apply a third voltage to a non-selected first line other than the selected first line, and apply a fourth voltage which is larger than the third voltage to a non-selected second line other than the selected second line,
a first absolute value of a difference between the third voltage and the fourth voltage being set smaller than a second absolute value of a difference between the first voltage and the second voltage by an offset voltage,
the control circuit being configured to increase the offset voltage as the second absolute value increases, and
a polarity of voltage applied to the variable resistance element at the setting operation is opposite to a polarity of voltage applied to the variable resistance element at the resetting operation.

15. The semiconductor memory device according to claim 14, wherein
the control circuit is configured to, when performing either one of the setting operation or the resetting operation, apply the third voltage to the non-selected first line and apply the fourth voltage to the non-selected second line, and the control circuit is configured to, when performing the remaining other of the setting operation or the resetting operation, apply a fifth voltage having a value between the first voltage and the second voltage to the non-selected first line and the non-selected second line.

16. The semiconductor memory device according to claim 14, wherein
the offset voltage increases quadratically as the second absolute value increases.

17. The semiconductor memory device according to claim 14, wherein
the third voltage is equal to the second voltage, and
the fourth voltage has a value obtained by subtracting the offset voltage from the first voltage.

18. The semiconductor memory device according to claim 14, wherein
the fourth voltage is equal to the first voltage, and
the third voltage is equal to the offset voltage.

19. The semiconductor memory device according to claim 14, wherein
the third voltage is smaller than the offset voltage,
the fourth voltage has a value obtained by subtracting a value of a sixth voltage which is smaller than the offset voltage from a value of the first voltage, and
the offset voltage is a sum of the sixth voltage and the third voltage.

20. The semiconductor memory device according to claim 2, wherein the memory cells have rectifying element connected to the variable resistance element in series, and the rectifying element is a bidirectional diode.

21. The semiconductor memory device according to claim 2, wherein
the control circuit is configured to, when performing either one of the setting operation or the resetting operation, apply the third voltage to the non-selected first line and apply the fourth voltage to the non-selected second line, and
the control circuit is configured to, when performing the remaining other of the setting operation or the resetting operation, apply a fifth voltage having a value intermediate between the first voltage and the second voltage to the non-selected first line and the non-selected second line.

22. The semiconductor memory device according to claim 15, wherein the memory cells have rectifying element connected to the variable resistance element in series, and the rectifying element is a bidirectional diode.

* * * * *